METHODS OF MAKING SEMICONDUCTOR DEVICES

Filed July 29, 1957

CHARACTERISTIC CURRENT-VOLTAGE CURVE OF DEVICE SHOWN IN FIG. 4.

INVENTOR.
KURT WEISER
BY J. L. Whittaker
ATTORNEY

United States Patent Office 2,980,560

Patented Apr. 18, 1961

2,980,560

METHODS OF MAKING SEMICONDUCTOR DEVICES

Kurt Weiser, Princeton, N.J., assignor to Radio Corporation of America, a corporation of Delaware Filed July 29, 1957, Ser. No. 674,759

6 Claims. (Cl. 148—1.5)

This invention relates to improved methods of making semiconductor devices. More particularly, it relates to improved methods of forming PN junctions in compound semiconductors.

In addition to germanium and silicon, certain binary compounds exhibit useful semiconductive properties. One such group of compounds includes the phosphides and arsenides of aluminum, gallium, and indium. Members of this group are known as III–V compounds, since each contains one constituent from column III and one constituent from column V of the periodic table. Some of the constituents mentioned are volatile, for example phosphorus and arsenic. Members of this group are generally made by direct synthesis from the elements. The compounds are usually of N-conductivity type as originally prepared, due to the presence of impurities, but if the compounds are pure they are still effectively N type since they exhibit high electron mobility and low hole mobility.

Semiconductive devices have been fabricated by introducing rectifying barriers, also known as PN junctions, in wafers of compound materials such as the phosphides and arsenides mentioned above. PN junctions have been introduced in these materials by several methods. One method is the surface alloy process, in which a pellet of a material that induces conductivity of given type is alloyed to the surface of an opposite conductivity type wafer of the semiconductive compound. The type-determining materials are also known as impurities, or doping agents. Another method of preparing PN junctions in these materials is to treat a given conductivity type wafer of the semiconductive compound in an ambient atmosphere containing a vaporized type-determining material which induces conductivity of the opposite type.

An object of the invention is to provide improved methods of making improved semiconductor devices.

Another object is to provide improved PN junctions in semiconductor devices.

Still another object is to provide an inexpensive method of fabricating semiconductor devices from binary compounds.

Yet another object is to provide a rapid and simple method of introducing PN junctions in semiconductive binary compounds.

These and other objects are accomplished by the instant invention, which provides an improved method of introducing PN junctions in binary semiconductive compounds which contain one volatile constituent. In a preferred form of the invention, wafers are prepared from a quantity of the semiconductive compound. The material as originally prepared is of given conductivity type, but is converted to opposite conductivity type by adding a sufficient amount of a suitable type-determining impurity. The impurity added is one which has a segregation coefficient in the compound smaller than that of the opposite type impurities present. A region of the wafer is locally heated to a temperature below the melting point of the compound, but above the temperature at which the compound appreciably decomposes. The wafer is then cooled. A PN junction is formed around the previously heated region of the wafer.

The invention and its features will be more fully described by the following detailed description, in conjunction to the drawing, wherein.

Similar reference numerals are applied to similar elements throughout the drawing.

Figure 1:
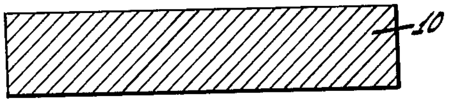
Figures 1–4 are sectional elevational views showing successive steps in the fabrication of a semiconductor device in accordance with the method of this invention.

Referring to Figure 1, a wafer 10 is prepared from a semiconductive binary compound which contains one volatile constituent. Examples of such compounds are the phosphides and arsenides of aluminum, gallium, and indium. In each compound the volatile constituent, such as phosphorus and arsenic, is non-metallic. The remaining constituent, such as aluminum, gallium, and indium, is relatively non-volatile, and is metallic in nature.

The compound as prepared is usually of given conductivity type, but is converted to opposite conductivity type by the addition of an appropriate impurity. In this example, the wafer 10 is composed of indium phosphide. A convenient way to prepare the indium phosphide is to melt together stoichiometric amounts of pure indium and pure phosphorus in a sealed tube. As prepared, indium phosphide is usually of N-conductivity type, due to various contaminants in the starting materials. The compound is then converted to opposite conductivity type, which in this example is P-conductivity type, by remelting the compound with a sufficient amount of a suitable doping agent. In this example, since the doping agent must induce P-type conductivity in the compound, an acceptor is required.

The impurity or doping agent selected is subject to another condition, as stated above. The segregation coefficient of the doping agent in the semiconductive compound used must be smaller than the segregation coefficient of the opposite type impurities which are present in the compound. The segregation coefficient of an impurity substance in a semiconductor may be defined as the ratio of the concentration of the impurity substance in the solid semiconductor to the concentration of the impurity in the liquid semiconductor when the solid and liquid phases are in equilibrium, that is, the solid is in contact with the melt. When two different impurities are present in relatively small proportions within a single system, they act substantially independently of each other with respect to segregation between the two phases. The following relationship must exist between the concentrations and segregation coefficients of the added impurity material, which in this example is an acceptor, and the impurities originally present, which in this example are donors:

$$\frac{K'}{K} < \frac{C}{C'}$$

where K′ is the segregation coefficient of the added type-determining material which induces given conductivity type, K is the segregation coefficient of the contaminants and impurities originally present which induce opposite conductivity type, C′ is the atomic concentration of the added type-determining material, C is the atomic concentration of the impurities which induce opposite conductivity type.

In this example, since the indium phosphide as originally prepared is of N-conductivity type, having for example an electron concentration of about $4\times10^{15}$ per cc., the added type-determining material must be an acceptor so as to induce P-conductivity type. Materials such as zinc and cadmium are suitable acceptors for the III–V compounds such as the phosphides and arsenides of aluminum, gallium, and indium, and exhibit segregation coefficients in these compounds within the desired range of values to satisfy the above equation. In this example, cadmium is utilized as the acceptor. Sufficient cadmium is added to the molten indium phosphide to produce a hole concentration of about $1\times10^{16}$ per cc.

Figure 2:
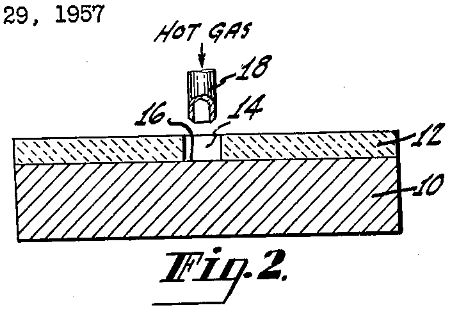

Referring to Figure 2, a desired region 16 of one face of the wafer 10 is heated by any convenient method to a temperature below the melting point of the wafer, but above the temperature at which appreciable decomposition begins due to the loss of the volatile constituent of the wafer. Such local heating may for example, be performed by focussing radiant energy on the desired site. In this example, a mask 12 of an inert heat-resistant material such as graphite is placed over one face of the wafer 10. The mask 12 has a well 14 which exposes the wafer portion 16 to be heated. A tube 18 is positioned over the well 14, and is utilized to direct a stream or jet of a hot gas against the desired wafer region 16. The gas is preferably inert. In this example, the gas used is helium. Indium phosphite melts at 1070° C., and begins to dissociate appreciably at about 700° C. A suitable temperature for the helium jet in this example is about 900° C. The wafer region 16 is exposed to the hot helium jet for about one minute. The wafer 10 is then cooled to about room temperature.

Figure 3:
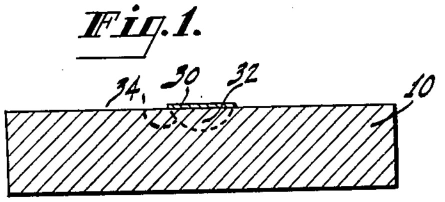

Referring to Figure 3, the region which was heated is found on cooling to be covered by a film 30 of indium. The wafer portion 32 immediately beneath the indium film is converted to N-conductivity type. At the interface 34 between the N-type region 32 and the P-type bulk of the wafer 10, a rectifying barrier or PN junction is formed.

Figure 4:
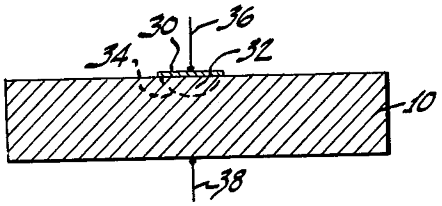

Referring to Figure 4, the device is completed by ohmically attaching lead wire 36, which may for example consist of copper or tungsten, to the indium layer 30. Another lead wire 38, which may consist of tungsten or platinum, is soldered to the wafer 10. This connection is also ohmic, and is conveniently made coaxially to lead 36 but on the opposite face of the wafer 10. The device may then be encapsulated and cased by conventional methods known to the semiconductor art.

Figure 5:
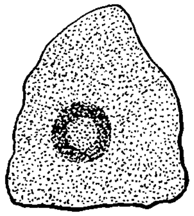
Figure 5 is a reproduction of a photograph of a typical PN junction in accordance with one embodiment of this invention.

Figure 5 is a reproduction of an enlarged photograph of a typical PN junction fabricated by directing a stream of hot helium against one face of a cadmium-doped indium phosphide wafer. The dark ring outlines the surface area of the wafer which was exposed by the mask and heated by the helium jet. The region of the wafer inside the dark ring and directly beneath it is converted to N-conductivity type, while the bulk of the wafer remains P-conductivity type. It will be understood that the region converted to P-type is ring-shaped merely because well 14 in the mask 10 was circular in cross section. The P-type region may be fabricated with any desired shape by utilizing a mask with a well having the appropriate cross section.

Figure 6:
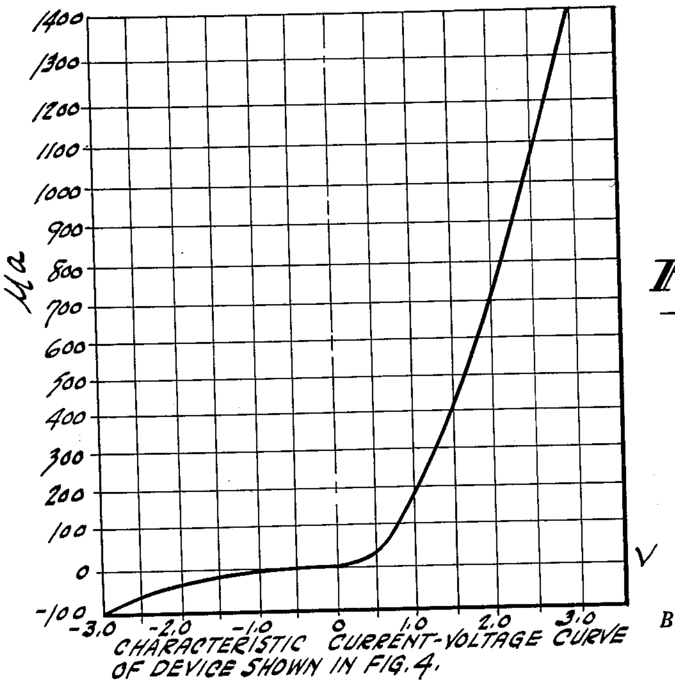
Figure 6 is a diagram of the current-voltage characteristic of the junction shown in Figure 5.

Figure 6 is a diagram of the voltage-current curve of the device shown in Figure 4. Since the device contains a single PN junction, it is of the type known as rectifying diodes. It will be recognized that the curve is characteristic of such single-junction rectifiers. The ratio of the forward current to the reverse current is about 14 to 1 at 3 volts.

Although the invention has been described in terms of a single-junction device, it will be appreciated that the process may be utilized to form devices with a plurality of junctions by locally heating separate regions on a single wafer. For example, a transistor may be conveniently fabricated by repeating the process shown in Figures 2 and 3 on the opposite face of the wafer, then connecting an emitter lead to one N-type region, a collector lead to the other N-type region, and a base lead to the unchanged bulk of the wafer. To save time, the two N-type regions may be prepared together by simultaneously heating the desired two regions of the wafer.

One feature of this invention is that the process can be carried out at any temperature between the onset of decomposition of the compound and the melting point of the compound. The composition of the molten region can thus be varied by varying the temperature of local heating, since the solubility of the compound in the molten metal left behind varies directly with the temperature. Another feature of the invention is that a metal-to-semiconductor contact is automatically established after recrystallization. For example, when the compound used is indium phosphide, a thin film of indium is formed on the surface of the heated region. This metallic film is useful in attaching a lead wire to the wafer.

The formation of PN junctions by the method of this invention may be explained as follows. The local heating partly decomposes a portion of the wafer by driving off the volatile constituent. The remaining constituent, which in the example described is indium, melts and dissolves a portion of the compound. As the temperature increases, the amount of the compound which is dissolved increases. On cooling the wafer to room temperature, the solubility of the dissolved compound in the melt decreases, so that the dissolved compound is precipitated and refreezes. As the dissolved portion of the compound recrystallizes, the added impurity material is divided between the solid and liquid phases in accordance with the segregation coefficient of the impurity. If the impurity selected has a segregation coefficient K less than unity, then the concentration of the impurity in the recrystalized solid will be decreased by a factor of K. The opposite type impurities originally present are not equally decreased in the recrystallized solid, since the impurity added, such as cadmium in the example above, is one which has a segregation coefficient smaller than that of the opposite type impurities present. Thus in the recrystallized region the concentration of the impurities originally present exceeds the concentration of the added impurity, such as the cadmium in the example discussed above, and hence the recrystallized region is of opposite conductivity type to that of the bulk of the wafer. As the dissolved compound refreezes, the melt becomes richer in the non-volatile constituent, which in the example described is indium. This non-volatile constituent freezes last and forms a metallic film over the recrystallized region. In the example described, the metallic film was indium, while with aluminum phosphide wafer, the metallic film is aluminum, and with gallium arsenide wafers, the metallic film consists of gallium. The metallic film contains the impurity material which was rejected by the recrystallized portion of the wafer. Thus, in the example described, the indium film formed over the heated region contains the cadmium which was rejected by the refrozen indium phosphide.

In the case of cadmium doped indium phosphide, the segregation coefficient of cadmium, which is normally about 0.1, decreases as the indium content of the melt increases. A desired value of K can thus be obtained by a suitable choice of the temperature used in the local heating of the selected region of the wafer, since this temperature, in turn, determines the ratio of indium to indium phosphide in the melt. Similarly, the segregation coefficient of zinc in the III–V compounds mentioned is also less than unity.

The dependence of the segregation coefficient on the composition of the melt will now be discussed. The basic relationship determining the segregation constant, K, of an impurity in terms of its intrinsic properties and its interaction with the host material was developed by Thurmond and Struthers in the following two equations:

$$(1)\qquad \ln k = \frac{\Delta H_2^f - \Delta H_2^s}{RT} - \frac{\Delta S_2^f}{R} + \ln \gamma_2$$

$$(2)\qquad \ln \gamma_2 = \frac{b}{RT}(1-x_2)^2$$

where $x_2$ is the mol fraction of an impurity in the melt, $\Delta H_2^f$ and $\Delta S_2^f$ are the heat and entropy of fusion of the impurity, R is the gas constant and T is the absolute temperature. The interaction terms of the impurity with the host matrial are $\Delta H_2^s$ and $b$, which correspond to the heat of solution in the solid and in the melt respectively. For a complete discussion of these equations, see C. D. Thurmond and J. D. Struthers, J. Phys. Chem. 57, 831 (1953).

It is clear that a compound containing a volatile and a non-volatile component, e.g., GaAs or InP, can be grown under a pressure of the volatile component such that the melt is either slightly rich in the metal or in the non-metallic constituent. Similarly, when such a compound is partially dissolved in its molten, metallic constituent, e.g., InP in indium, the composition of the melt will depend on the temperature. When such a melt is cooled the crystals obtained will contain a slight excess of either constituent, depending on its composition. In the case of III–V compounds it has been found that the solid solubility of either group III or group V elements is negligible compared to the concentration of impurities ordinarily present so that for all practical purposes the crystal composition remains stoichiometric.

When an impurity is present in the melt the value of $\Delta H_2^s$ will therefore not be appreciably affected. The segregation coefficient of the impurity will, however, be changed because of Equation 2 which deals with the interaction of the impurity atom with the melt atoms. The magnitude of $b$ depends on the nature of the melt, and may vary considerably. For example, Thurmond found that the value of $b$ for Al in Ge is −2500 cal./g.-atom, while for Tl in Ge the value of $b$ is +3640 cal./g.-atoms. See C. Thurmond, J. Phys. Chem. 57, 827 (1953). One would therefore, expect that the value for $b$ of an impurity in, say, InP depends on the melt composition since the impurity atom will be in contact with varying ratios of InP : In, or InP : P molecules, depending on whether the melt contains excess indium or excess phosphorus.

It will be appreciated that the practice of this invention is not limited to introducing N-type regions in P-type wafers. Wafers that are originally of P-conductivity type may be converted to N-type by the addition of a suitable donor impurity with a segregation constant smaller than that of the acceptors present. On heating a selected portion of the wafer, a P-type region is formed in an N-type wafer.

It will be understood that the above described arrangements are merely illustrative of the principles of the invention. For example, the added impurity may be introduced into the semiconductive compound during the initial preparation of the material. Many other arrangements may be devised for locally heating the semiconductive wafer, and other compound semiconductors containing a volatile constituent may be utilized by those skilled in the art without departing from the spirit and scope of the invention.

What is claimed is:

1. The method of introducing a PN junction in a given conductivity type wafer of a semiconductive compound selected from the group consisting of the phosphides and arsenides of aluminum, gallium, and indium, said wafer containing both acceptor type-determining materials selected from the group consisting of zinc and cadmium and donor type-determining materials in relative proportions such that the following relationship is satisfied:

$$\frac{K'}{K} < \frac{C}{C'}$$

where

K′ is the segregation constant of said type-determining material of given conductivity type,
K is the segregation constant of said type-determining material of opposite conductivity type,
C′ is the atomic concentration of said type-determining material of given conductivity type
C is the atomic concentration of said type-determining material of opposite conductivity type, comprising heating a region of said wafer to a temperature below the melting point of the compound but above the temperature at which the compound appreciably decomposes, then cooling the wafer.

2. The method of forming a rectifying barrier in a given conductivity type crystalline wafer of a semiconductive binary compound, said compound being selected from the group consisting of the phosphides and arsenides of aluminum, gallium, and indium, said wafer containing both acceptor type-determining materials selected from the group consisting of zinc and cadmium and donor type-determining materials in relative proportions such that the following relationship is satisfied:

$$\frac{K'}{K} < \frac{C}{C'}$$

where

K′ is the segregation constant of said type-determining material of given conductivity type,
K is the segregation constant of said type-determining material of opposite conductivity type,
C′ is the atomic concentration of said type-determining material of given conductivity type
C is the atomic concentration of said type-determining material of opposite conductivity type, comprising locally heating a region of said wafer, said heating being performed at a temperature below the melting point of the compound but above the temperature at which the compound appreciably decomposes, then cooling the wafer.

3. The method of introducing a PN junction in a given conductivity type crystalline wafer of a semiconductive binary compound, said compound being selected from the group consisting of the phosphides and arsenides of aluminum, gallium, and indium, said wafer containing both acceptor type-determining materials selected from the group consisting of zinc and cadmium and donor type-determining materials in relative proportions such that the following relationship is satisfied:

$$\frac{K'}{K} < \frac{C}{C'}$$

where

K′ is the segregation constant of said type-determining material of given conductivity type,
K is the segregation constant of said type-determining material of opposite conductivity type,
C′ is the atomic concentration of said type-determining material of given conductivity type
C is the atomic concentration of said type-determining material of opposite conductivity type, comprising heating a region of said wafer to a temperature below the melting point of said compound but above the temperature at which the compound appreciably decomposes, whereby a quantity of said volatile element is driven off and a molten mass of said metal remains on said wafer, then cooling the wafer to room temperature.

4. The method of introducing a PN junction in a given conductivity type wafer of a semiconductive binary compound consisting of a metallic constituent and a volatile non-metallic constituent, said compound being selected from the group consisting of the phosphides and arsenides of aluminum, gallium, and indium, said wafer containing both acceptor type-determining materials selected from the group consisting of zinc and cadmium and donor-type-determining materials in relative proportions such that the following relationship is satisfied:

$$\frac{K'}{K}<\frac{C}{C'}$$

where

K' is the segregation constant of said type-determining material of given conductivity type,
K is the segregation constant of said type-determining material of opposite conductivity type,
C' is the atomic concentration of said type-determining material of given conductivity type,
C is the atomic concentration of said type-determining material of opposite conductivity type, comprising locally heating a region of said wafer to a temperature below the melting point of said compound but above the temperature at which the compound appreciably decomposes, so that a quantity of the non-metallic constituent is driven off and a molten mass of the metallic constituent remains on the surface of said wafer and dissolves a portion of said compound, then cooling said wafer to recrystallize said dissolved portion, whereby said given conductivity type-determining material is depleted from said recrystallized region and said region is converted to opposite conductivity type.

5. The method of introducing a PN junction in a cadmium-doped P conductivity type wafer of a semiconductive binary compound consisting of a metallic constituent and a volatile non-metallic constituent, said compound being selected from the group consisting of the phosphides and arsenides of aluminum, gallium, and indium, said wafer containing both cadmium and donor type-determining impurities in relative proportions such that the following relationship is satisfied:

$$\frac{K'}{K}<\frac{C}{C'}$$

where

K' is the segregation constant of said cadmium in said compound,
K is the segregation constant of said donor type-determining materials in said compound,
C' is the atomic concentration of cadmium in said compound,
C is the atomic concentration of said donor type-determining materials, comprising locally heating a region of said wafer to a temperature below the melting point of said compound but above the temperature at which the compound appreciably decomposes, so that a quantity of the non-metallic constituent is driven off and a molten mass of the metallic constituent remains on the surface of said wafer and dissolves a portion of said compound, then cooling said wafer to recrystallize said dissolved portion, whereby said cadmium is depleted from said recrystallized region and said region is converted to N conductivity type.

6. The method of introducing a PN junction in a zinc-doped P conductivity type wafer of a semiconductive binary compound consisting of a metallic constituent and a volatile non-metallic constituent, said compound being selected from the group consisting of the phosphides and arsenides of aluminum, gallium, and indium, said wafer containing both zinc and donor type-determining impurities in relative proportions such that the following relationship is satisfied:

$$\frac{K'}{K}<\frac{C}{C'}$$

where

K' is the segregation constant of said zinc in said compound,
K is the segregation constant of said donor type-determining materials in said compound,
C' is the atomic concentration of zinc in said compound,
C is the atomic concentration of said donor type-determining materials, comprising locally heating a region of said wafer by means of a jet of hot gas to a temperature below the melting point of said compound but above the temperature at which the compound appreciably decomposes, so that a quantity of the non-metallic constituent is driven off and a molten mass of the metallic constituent remains on the surface of said wafer and dissolves a portion of said compound, then cooling said wafer to recrystallize said dissolved portion, whereby said zinc is depleted from said recrystallized region and said region is converted to N conductivity type.

References Cited in the file of this patent

UNITED STATES PATENTS

| | | |
|---|---|---|
| 2,739,088 | Pfann | Mar. 20, 1956 |
| 2,798,989 | Welker | July 9, 1957 |
| 2,815,303 | Smith | Dec. 3, 1957 |
| 2,817,608 | Pankove | Dec. 24, 1957 |
| 2,822,309 | Hall | Feb. 4, 1958 |
| 2,847,335 | Gremmelmaier | Apr. 12, 1958 |

OTHER REFERENCES

B. A. Rogers, The Nature of Metals, published by The American Society for Metals, 1951, pages 4 and 5.

Physical Review, vol. 92, No. 6, pages 1573–1575 (article by Wayne W. Scanlon).